United States Patent
Schulte

(10) Patent No.: US 9,909,232 B2
(45) Date of Patent: Mar. 6, 2018

(54) EPITAXIAL GROWTH USING ATMOSPHERIC PLASMA PREPARATION STEPS

(71) Applicant: ONTOS Equipment Systems, Inc., Chester, NH (US)

(72) Inventor: Eric Frank Schulte, Santa Barbara, CA (US)

(73) Assignee: Ontos Equipment Systems, Inc., Chester, NH (US)

(*) Notice: Subject to any disclaimer, the term of this patent is extended or adjusted under 35 U.S.C. 154(b) by 0 days.

(21) Appl. No.: 15/239,820

(22) Filed: Aug. 17, 2016

(65) Prior Publication Data

US 2017/0051431 A1    Feb. 23, 2017

Related U.S. Application Data

(60) Provisional application No. 62/205,938, filed on Aug. 17, 2015.

(51) Int. Cl.
C30B 23/02 (2006.01)
H01J 37/32 (2006.01)

(52) U.S. Cl.
CPC ...... *C30B 23/025* (2013.01); *H01J 37/32018* (2013.01); *H01J 37/32825* (2013.01); *H01J 37/32348* (2013.01)

(58) Field of Classification Search
CPC combination set(s) only.
See application file for complete search history.

(56) References Cited

U.S. PATENT DOCUMENTS

2011/0011531 A1* 1/2011 Schulte ................. H01L 24/11
156/281

* cited by examiner

*Primary Examiner* — Duy Vu N Deo
*Assistant Examiner* — Erin F Bergner
(74) *Attorney, Agent, or Firm* — Robert O. Groover, III; Gwendolyn G. Corcoran; Groover & Associates PLLC

(57) ABSTRACT

After CMP and before an epitaxial growth step, the substrate is prepared by an atmospheric plasma which includes not only a reducing chemistry, but also metastable states of a chemically inert carrier gas. This removes residues, oxides, and/or contaminants. Optionally, nitrogen passivation is also performed under atmospheric conditions, to passivate the substrate surface for later epitaxial growth.

13 Claims, 6 Drawing Sheets

Reducing downstream

Oxidizing downstream

EPITAXIAL GROWTH USING ATMOSPHERIC PLASMA PREPARATION STEPS

CROSS-REFERENCE

Priority is claimed from U.S. provisional application 62/205,938, which is hereby incorporated by reference.

BACKGROUND

The present application relates to epitaxial growth, and especially to epitaxial growth of monocrystalline semiconductor layers on monocrystalline substrates composed of a different material ("heteroepitaxial deposition").

Note that the points discussed below may reflect the hindsight gained from the disclosed inventions, and are not necessarily admitted to be prior art.

One of the basic steps in semiconductor processing is deposition of thin layers of material. Epitaxy is the special case where crystalline material is deposited onto a monocrystalline substrate, under conditions where the new material continues the same crystal lattice, with the same orientation, as the substrate.

The specific case where the added material has a different composition from the substrate is sometimes referred to as heteroepitaxial deposition. Heteroepitaxial deposition is easiest when the lattice constant of the epitaxial material is equal to that of the substrate material: otherwise there will be strain (tension or compression) in the material. However, perfect lattice match is often impossible.

Molecular Beam Epitaxy ("MBE") is one example of an epitaxial deposition process. In this process a substrate is held under very high vacuum, and usually heated (e.g. to a few hundred degrees Celsius). Source atoms or molecules are released very slowly to impinge on the exposed substrate, to permit slow crystal growth.

Epitaxial deposition can also be performed from the vapor phase. Such processes use a variety of source gasses, and typically achieve much faster crystal growth. Epitaxial growth from liquid or solid phases is also possible.

A particular challenge is preparation of the substrate before epitaxial deposition. The epitaxial deposition process requires that the incoming atoms (the "adatoms") be preferentially attracted to the lattice sites, in the exposed surface of the crystalline substrate, which will continue the substrate's lattice as crystal growth occurs. The problem is that any deviation from perfect alignment of the adatoms can initiate twinning or defects, which degrade the properties of the epitaxial layer. Once defects or twinned domains are initiated, they may propagate as the growth plane moves.

The alignment of each layer of grown crystal is defined by the crystal lattice layer just before it. This is what allows growth of a crystalline material, but this also permits defects in the existing surface to propagate into the new material as the crystal grows. In other words, each newly-deposited layer is defined by the surface layer, and not the bulk crystal, of the crystalline material it grows onto.

This is not a great difficulty during conventional growth processes, but it indicates one source of weakness: growth must be initiated at some point, and a good crystal lattice surface must be available, at that point, for the newly grown layers to align themselves. Much effort has been invested in developing epitaxial growth processes, but (depending on the substrate material) initiation of epitaxial deposition can still be an important source of defects.

Conventionally a CMP (chemo-mechanical polishing) step is used to provide an atomically ordered crystal lattice surface.

The present application relates to the preparation of solid crystalline substrate surfaces in conjunction with epitaxial growth of semiconductor layers upon that substrate. The quality of epitaxial layers (Epi layers) grown on substrates (e.g. InGaAs grown on GaSb substrates) depends upon the perfection of the atomic lattice at the surface of the substrate, and lack of interfering species on that surface such as oxygen, carbon, hydrocarbons, $H_2O$, OH, and other species, which would disrupt the uniform growth of Epi layer atomic structure as an extension of the substrate atomic lattice.

Standard industrial practices in preparing a substrate for Epi growth involve a number of typical steps:

1. Chemical-mechanical polishing of the substrate to produce a pristine, ordered crystalline surface, free of lattice anomalies;

2. Cleaning of the substrate surface with organic solvents and acids after polishing to remove any residue from the polishing process;

3. Growth of an intentional oxide on the prepared surface, typically in a furnace with high-purity oxygen present;

4. Storing the oxidized substrate wafer for later use in a sealed container;

5. (Optionally) cleaning the surface of the substrate to remove organic contamination which has accumulated on the surface due to outgassing of storage packaging;

6. Placing the wafer into an epitaxial growth machine with high-vacuum capability;

7. Heating the wafer to very high temperatures in high vacuum in order to desorb organic contamination and also the grown oxide layer (from step 3);

8. Growth of the epitaxial layer(s).

Step 1 above uses lapping slurries, lapping pads, acid solutions and polishing pads to progressively remove sawing damage from the wafer and eventually produce a smooth surface with high crystalline regularity in the atomic lattice on the immediate surface of the substrate.

Step 2 above must remove all traces of lapping compounds and polishing chemicals from the surface of the substrate without disrupting or damaging the pristine crystalline lattice on the surface of the substrate. This is very difficult to do, and typically utilizes proprietary solvent and acid rinses which consume large amounts of these solvents and acids which must then be disposed according to increasingly strict environmental regulations. Extreme care is taken to remove as much of the lapping and polishing residues as possible without causing any disruption of the pristine surface crystallinity. Since the surface must not be contacted by any mechanical apparatus, complete removal of all residue is extremely difficult. Some substrate manufacturers have tried vacuum plasma cleaning to remove final residues, but the atomic bombardment in this type of plasma system damages the surface lattice structure, thus defeating the whole surface preparation process. Additionally, any process that requires the substrate to pass into and out of a vacuum chamber slows the throughput of the cleaning process. What is needed is a method of removing all polishing residue quickly, without contacting the substrate surface, without requiring a slow vacuum process, and without bombarding or damaging the surface in any way.

Step 3 above brings about the growth of an oxide protection layer on the surface of the substrate, which performs a number of functions:

a) It consumes some of the surface lattice atoms which might still contain some damage or crystalline irregularity from the cleaning process (step 2, above).

b) It creates a new pristine semiconductor surface at the base of the oxide layer.

c) The oxide prevents the pristine crystalline surface from gettering oxygen, carbon, hydrocarbons, H2O, OH, etc. during storage and/or transport of the substrate.

d) The oxide must be of a composition that is completely desorbed upon heating in high-vacuum Epi deposition equipment.

This oxide surface protection scheme has a number of drawbacks and challenges:

a) The oxide layer grown has a different lattice constant than the underlying semiconductor lattice, thereby inducing stress into the semiconductor right at the critical interface. This can result in dislocations, slip, and other crystalline lattice disruptions which are detrimental to subsequent Epi growth.

b) Typical Epi substrates are compound semiconductors, for example, GaSb. The oxidation rate of the cations (gallium, in this example) is typically different than the oxidation rate of the Anions (antimony, in this example), and so the oxide grown is often non-stoichiometric, imperfect, and strained. This results in stress, possible gettering of unwanted species such as carbon; and uneven desorption during the pre-deposition high-temperature removal of the oxide.

c) In some compound semiconductor schemes, certain oxidation states of anions or cations require extremely high desorption temperatures (undesirable).

As described below, the present application provides a method to protect the pristine crystalline surface, that does not damage the surface lattice, does not strain the surface lattice, that is uniformly effective at passivating the dangling bonds of the surface lattice such that they will not getter undesirable species, and desorbs uniformly and completely under modest heating in the Epi deposition system, thus leaving a pristine crystalline surface upon which to grow epitaxial layers.

Steps 4 and 5 above, are required if the substrates are produced in one location and used in another (which is most often the case.) Epi substrate wafers are typically stored and transported in individual polymer containers. These containers are known to outgas organic components onto the wafer surface. Some Epi growth labs assume these organics will desorb as the wafer is heated up in the high-vacuum deposition apparatus. However, other organizations realize that these organics will create problems in their high-vacuum pumping systems and decrease the required mean-time-between-system-cleans. These labs typically use solvent rinses of the substrate in order to remove these adventitious organic residues. However, the process of wet solvent cleans in less-than-perfect environments can introduce other contaminants to the substrate surface, which eventually end up in the high-vacuum deposition apparatus. Additionally, these solvents must be disposed of in environmentally sound ways, thus incurring significant additional cost. What is needed is a way to remove all organic contamination from Epi substrates before they go into the Epi growth system without introducing new contaminants, without damaging the surface, and without the use of costly and environmentally undesirable solvents.

Step 7 above (the desorption of the oxide protective film inside the Epi deposition apparatus) is typically the most critical step in conventional Epi substrate surface preparation. All of the oxide must be uniformly desorbed from the substrate surface in order to leave exposed the pristine crystalline substrate surface upon which the Epi films will grow. If there is any residual contamination from the polishing process, any residual organic contamination from atmospheric exposure or packaging outgassing, any non-stoichiometric oxides, or any high-temperature oxides, the Epi films grown upon the substrate will contain defects which can eventually cause device defects and yield loss in the subsequent semiconductor manufacturing process. What is needed is a method to protect the pristine crystalline surface, that does not damage the surface lattice, does not strain the surface lattice, that is uniformly effective at passivating the dangling bonds of the surface lattice such that they will not getter undesirable species, and desorbs uniformly and completely under modest heating in the Epi deposition system, thus leaving a pristine crystalline surface upon which to grow epitaxial layers.

Note that the points discussed below may reflect the hindsight gained from the disclosed inventions, and are not necessarily admitted to be prior art.

Epitaxial Growth Using Atmospheric Plasma Preparation Steps

The present application describes new methods for forming epitaxial structures, and particularly new methods for surface preparation before deposition of an epitaxial layer is begun. In one class of embodiments, the present application teaches the use of downstream reactive components from an atmospheric plasma as a method of creating an optimum surface condition for subsequent epitaxial layer growth.

The present application discloses multiple inventions which are each believed to be novel and non obvious. Additionally, various combinations of these inventions confer various synergies, and are themselves believed to be independently novel and non obvious. It should be understood, therefore, that not all of the features described in this application are parts of any of the various innovative concepts described herein.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

Figure 1:
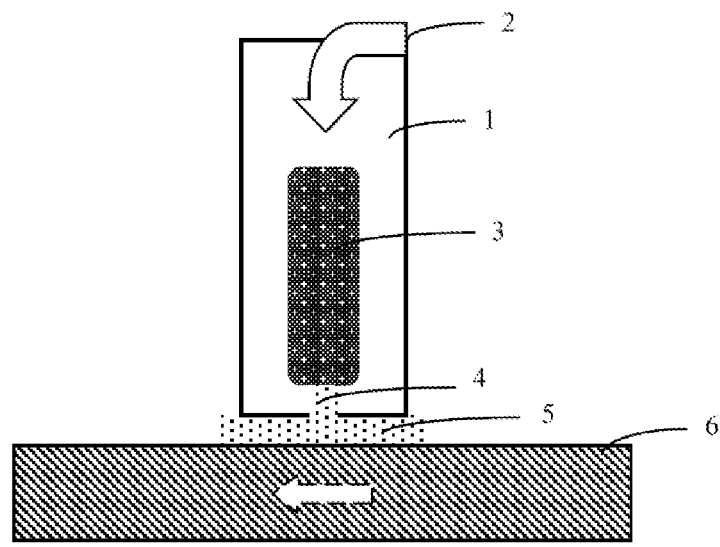
FIG. 1 schematically shows the application of downstream reactive residuals from an atmospheric plasma head to a substrate, preparatory to deposition of an epitaxial thin film.

The numerous innovative teachings of the present application will be described with particular reference to presently preferred embodiments (by way of example, and not of limitation). The present application describes several inventions, and none of the statements below should be taken as limiting the claims generally.

The present application teaches, among other innovations, a process which utilizes the downstream reactive residuals of an atmospheric plasma to provide multiple advantages to pre-Epi surface preparation with a simple apparatus. By employing a reducing chemistry combination of gasses, such as helium plus hydrogen, the downstream reactive hydrogen radicals created in the atmospheric plasma region inside the plasma head exit the head aperture and impinge the substrate surface. Four important surface preparation processes are performed simultaneously:

1. Carbon (organic residue) is removed from the surface of the substrate, without mechanically damaging the substrate.
2. Oxygen is removed from the surface of the substrate without mechanically damaging the substrate.
3. Other adventitious species such as $H_2O$, OH, nigrogen, Sulfur, Halides, etc. are removed from the surface of the substrate without mechanically damaging it.
4. The dangling bonds left behind after removal of the above species, create a highly activated pristine substrate surface, primed for chemical activity.

If the substrate can be translated directly into the Epi growth apparatus, further surface preparation is unnecessary. Epi growth proceeds unimpeded by oxides, carbon, or other surface blocking species, and the normal intermediate step of desorbing a passivation layer can be omitted.

If the substrate is to be stored for later use or shipment, the chemistry of the atmospheric plasma head is rapidly changed from reducing to oxidizing chemistry (such as helium plus oxygen or helium plus nigrogen), and a pure, controlled oxide or nitride film can be grown on the pristine surface. The purity of this grown surface passivation is ensured by the purity of the gasses used in the atmospheric plasma, and the fact that substrate need not be subjected to handling or vacuum chamber contamination that is normally required to grow such passivation films. The energetics and therefore the stoichiometry and thickness of the grown film is controlled by the atmospheric plasma parameters such as gas flows, RF power, scan rate, gap between aperture and substrate, etc. Once protected in this manner, the wafer can be stored and/or shipped for use at a later time or distant location.

Prior to entry into the Epi growth system, the wafer can be cleaned (and passivated, if desired) again by the above steps, using atmospheric plasma, to ensure that there is no residue from packaging or atmospheric exposure. Once again, the Epi operator has the choice of placing a pristine, unpassivated substrate into the Epi apparatus, and growing directly; or the operator can employ the atmospheric plasma to grow an oxide or nitride passivation layer which is then desorbed inside the Epi System just prior to Epi growth.

FIG. 1 schematically shows the application of downstream reactive residuals from an atmospheric plasma head to a substrate. The substrate is scanned relative to the downstream gas flow, thus subjecting the substrate to uniform treatment by the downstream reactive species which were created in the plasma region inside the atmospheric plasma head. Also shown in this drawing is the atmosphere exclusion zone created by the flow of process gas out of the plasma head exit aperture and then laterally between the bottom surface of the plasma head and the substrate.

Figure 2:
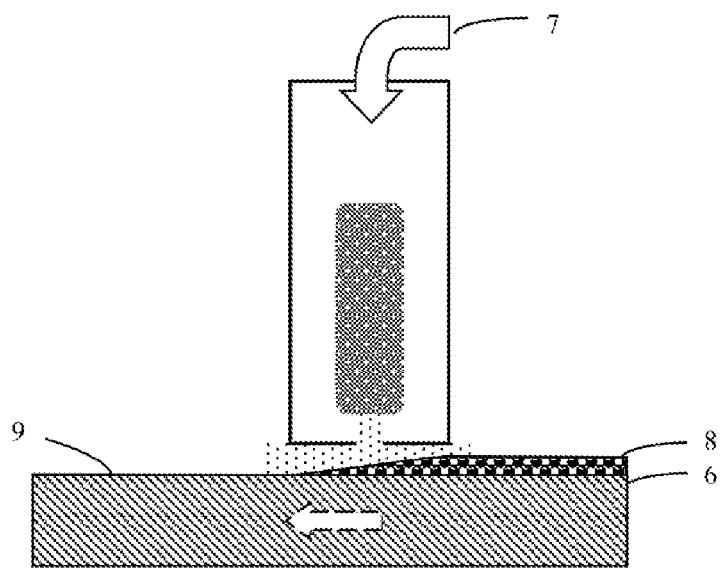
FIG. 2 shows a cross-section of an Epi substrate during processing, including the presence of oxidation, organic contamination and other adventitious species on the surface of the substrate.
Figure 3:
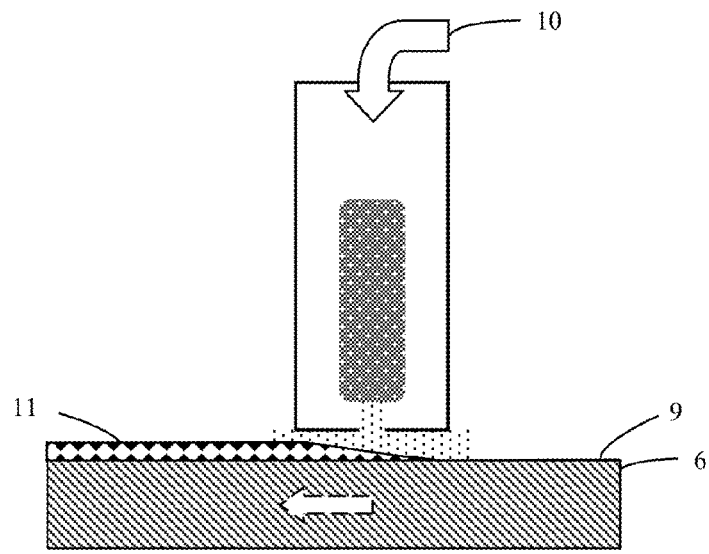
FIG. 3 shows an epitaxial substrate with a passivation layer.

FIG. 2 shows a cross-section of an Epi substrate including the presence of oxidation, organic contamination and other adventitious species on the surface of the substrate. As the substrate is scanned from right-to-left, the surface film(s) come under the influence of the chemically reactive radicals present in the downstream of the plasma, and are reacted away, leaving a pristine, undamaged surface ready for epitaxy; or ready for growth of a controlled passivation layer, as illustrated in FIG. 3.

Some notable features of the disclosed process are as follows. (However, it must be understood that the specific inventions for which protection is sought are defined only by the issued claims, and are not necessarily delimited by any of the following points.):

1. The selection of an atmospheric plasma source to provide downstream residuals to perform chemical modifications on the surface of the substrate, allowing the process to proceed in room ambient conditions, thus eliminating the expense and time limitations imposed by vacuum chambers, gas pumping systems, gas confinement chambers, etc.
2. The selection of a remote dielectric barrier discharge type of atmospheric plasma such that all high-energy species such as ions or hot electrons which are created in the remote plasma zone inside the plasma head are re-combined before the downstream gas exits the head aperture and impinges the surface of the substrate. The lack of high-energy components in the downstream enables the production of a pristine, undamaged crystalline lattice upon which to grow epitaxial layers or surface passivation layers.
3. The selection of specific reducing gas mixtures enables the efficient removal of oxygen, carbon, and other contamination by creating volatile species of these elements. The use of a noble gas such as helium, neon, argon, etc. provides for three functions: first, as a carrier gas to dilute the reducing gas (for example, hydrogen) to a non-flammable and non-explosive mixture; second, to provide a radio-frequency absorbing medium which enables efficient production of a stable plasma; and third, to provide metastable high-energy atoms which store energy in the form of long-lived quantum metastable states, such quantum energy then being transferred to the substrate surface upon contact, and thus providing additional atomic excitation for the activation of surface chemical reactions. The addition of a reducing gas, for example hydrogen, provides hydrogen radicals in the downstream which react with oxygen, carbon, hydrocarbons, nitrogen, hydroxyls, and other species on the substrate surface, to form volatile species which are swept away from the substrate surface in the process gas flow. The combination of metastable excitation and reducing radicals is highly effective at removing a broad variety of contaminants from the surface without inducing any physical damage to the underlying surface crystallinity.4.

The selection of specific passivation gas mixtures enables the controlled oxidation (or nitridation, etc.) of the substrate to protect the newly-created pristine semiconductor lattice from contaminants and physical damage. The use of a noble gas such as helium, neon, argon, krypton or xenon provides for three functions: (1) as a carrier gas to dilute the passivating gas (i.e. oxygen) to a non-flammable and non-explosive mixture; (2) to provide a radio-frequency absorbing medium which enables efficient production of radicals within the plasma; and (3) to provide metastable high-energy atoms which store energy in the form of long-lived metastable quantum states, thus providing additional atomic excitation for the activation of surface chemical reactions. The addition of oxygen, nitrogen, or other gasses into the plasma provides reactive downstream radicals which readily bond to the dangling bonds at the surface of the substrate, thus creating an oxide, nitride, oxy-nitride, or other atomic-level termination for those dangling bonds.

5. The selection of advantageous gas flow ratios, total flows, RF power level, scan speed, and gap between head and substrate enable optimization of the density of reactive species, density of metastable species, and surface temperature so as to produce the desired chemistry-energy regime for the type of surface reaction desired.

Each of the above-mentioned notable process features is described in more detail below.

Use of an Atmospheric Plasma Source

FIG. 1 shows an atmospheric plasma source (1) which provides a convenient source of chemical radicals (i.e. monatomic hydrogen) and metastable noble gas atoms (i.e. metastable quantum states of helium) (5) to perform surface modifications without the need for expensive vacuum chambers, pumping systems, and process gas confinement chambers. High-purity gasses are flowed down through the body of the source, passing through the glow-discharge plasma region where excited species of the gases are created. Long-lived radicals generated in the plasma zone flow downstream from the plasma zone and out the linear aperture located in the bottom face of the plasma head. A narrow gap of typically 1 millimeter is maintained between the bottom face of the plasma head and the underlying substrate so that as the gas flows out of the aperture, it fills the space between the head and substrate with process gas, and creates a laminar flow of process gas in all directions from the plasma aperture. This forces out all atmosphere from the region, creating an atmosphere-free process zone filled only with process gas. This creates a similar environment to a vacuum chamber, but without having to pump the region with time-consuming and expensive vacuum pumping equipment.

Selection of a Remote Dielectric Barrier Discharge Type of Atmospheric Plasma Source Dielectric barrier discharge (DBD) low-temperature atmospheric plasma sources (such as the Ontos7 plasma source supplied by SET-NA Corp.) confine the higher-energy plasma region to the interior of the plasma source so that no plasma comes in direct contact with the substrate. By the time the gas flow (2) passes out of the plasma region (3) and exits the aperture (4) in the bottom of the plasma source, all high-energy components such as ions, hot electrons, and kinetic bombardment species have lost their energy due to the high rate of particle collisions which occur under atmospheric pressure conditions. This ensures that the substrate (6) being treated does not suffer surface damage due to bombardment from high-energy particles such as typically occurs in a vacuum plasma system. Also, because the reactive residuals in the downstream from an atmospheric plasma source have no significant kinetic energy, they do not damage the atomic lattice structure at the immediate surface of the substrate under treatment. A specific type of atmospheric plasma, referred to as "dielectric barrier discharge" (DBD) atmospheric plasma eliminates the high-temperature arcing generally associated with simpler arc discharge or corona discharge atmospheric plasmas. The DBD atmospheric plasma is uniquely suited for low-energy preparation of Epi substrates where higher temperatures and direct exposure to arc discharges cannot be tolerated. Additionally, arc and corona discharges will sputter away electrode material into the downstream gas flow which would then contaminate the substrate with unwanted foreign material. Therefore, downstream DBD Atmospheric Plasma is uniquely suited for use in this application.

Selection of Specific Reducing Gas Mixtures

As stated earlier, the remaining active species in the downstream gas flow are longer-lived mono-atomic reducing atoms (i.e. hydrogen radicals H.), and metastable quantum-excited carrier gas atoms (i.e. excited helium states He*). These species are chemically and energetically enabled to react with oxygen, carbon, and other atoms on the surface to create volatile compounds of those atoms, thus removing them from the substrate surface. The ratio of reducing gas to carrier gas is important to the efficiency of the surface preparation processes. Carrier gas flow rate affects the time available for energy absorption while the gas passes through the plasma zone. Higher flow rates decrease the temperature rise of the gas in the plasma zone, and therefore reduce the heat load on the substrate. The selection of which gas to use as a carrier is very important. One must consider how the gas will behave in the high electric field surrounding the plasma zone, such as the breakdown voltage required to ionize the gas at room pressure conditions, and the sustaining voltage required to maintain plasma discharge once the plasma is lit. Other considerations include the thermal conductivity and thermal mass of the gas. Another extremely important factor is the nature of the metastable energy states that can be formed in the gas. For example, helium forms metastable states of approximately 20 eV of quantum energy, whereas argon forms metastable states of approximately 10 eV of quantum energy. The higher energy "content" of helium metastables makes helium a desirable choice for activating surface reactions requiring higher energy, such as the reduction of metal-oxides. Whereas, if only lower-energy metastables are required for a given surface reaction, argon could be used at a cost savings.

Hydrogen is generally preferred as a reducing gas, although other reducing gasses such as $NH_3$ can optionally and less preferably be utilized.

Selection of Appropriate Selection of Specific Passivation Gas Mixtures

The passivation gas should be chosen to suit the particular substrate being prepared. In some cases oxygen is a good choice, where oxides of the substrate material can be easily desorbed at elevated temperatures inside the Epi growth system. In other cases, one could consider nigrogen to reduce surface metal atoms to metal nitrides. Other reducing gasses, containing e.g. sulfur, can be beneficial in some cases. Halogen-containing gasses could also be used to form metal halides.

Other reducing gasses which contain sulfur, for example could be beneficial in some cases. Halide-containing gasses could also be used to form metal halides. Oxy-nitrides, formed by flowing both oxygen and nitrogen through the atmospheric plasma source, are also potentially useful as a passivation for certain substrates.

Any of these passivation layers greatly decreases the ability of adventitious oxygen, carbon, etc. to attach to the substrate surface. In effect, this acts as an atomic layer passivation. Because this layer is very thin and very pure, it is very readily (and uniformly) desorbed from the substrate surface with the application of heat in the Epi apparatus.

Selection of Appropriate Scan Speed and Gap

An important factor in the use of an atmospheric plasma head to perform chemical modification of surfaces is the exclusion of room air from the chemical reaction zone. FIG. 1 shows how the gas that transits the interior of the plasma head then exits an aperture in the bottom face of the plasma head and flows laterally between the substrate and the bottom surface of the plasma head. This lateral flow continually purges room air from the reaction zone directly under the plasma head. It is the absence of room air (mainly oxygen and nigrogen) that allows the reducing chemistry to stay at a high-enough density to perform reducing chemistry on the surface of the substrate. Any incursion of room air into the reaction zone reduces the efficiency of the downstream radical reactions. The selection of appropriate scan parameters and gap parameters are necessary to achieve maximum effect of the downstream reactive residuals on the substrate. Scan rate is governed by trade-offs in throughput vs. substrate heating vs. process reaction time vs. atmosphere exclusion kinetics. For throughput purposes, a higher scan speed is clearly desirable. A higher scan speed also minimizes heating of the substrate due to thermal exchange with the thermally excited gas flowing out of the plasma head. However, at higher scan speeds there is less time for the room air to be purged from the reaction zone, and therefore the reaction speed decreases. Similarly, if the gap is too large between the plasma head and the substrate more room air will remain in the reaction zone. However, if the gap is too small, additional heating of the substrate can occur which will leave the surface of the substrate still warm when it exits the exclusion zone as the scan proceeds. This can lead to reoxidation of the just-reduced surface. Multi-variable designed experiments have determined a range of gap and scan speed that produces optimum results. Typical scan speeds run from 1 mm/second up to 15 mm/second depending on how much organic and oxide removal is required. Typical gap spacing between the plasma head bottom surface and the substrate top surface is between 0.5 mm and 1.5 mm, depending on scan speed and reoxidation rate of the plating base material.

Some notable points of interest will now be described. However, again, it should be noted that the scope of the protected inventions is defined only by the allowed claims, and not by the specific examples given below.)

Figure 4:
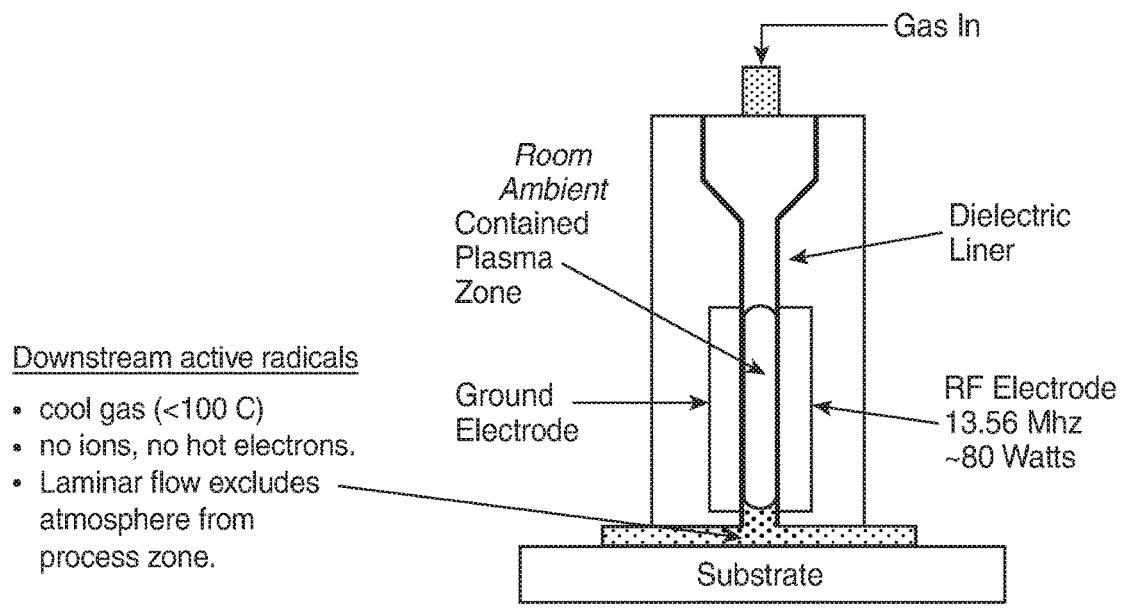
FIG. 4 shows one sample embodiment of an atmospheric plasma system as used in the presently preferred embodiments.

In the preferred embodiments, the atmospheric plasma for substrate preparation is provided by an Ontos Atmospheric Plasma unit, as seen in e.g. FIG. 4. This provides downstream active radicals, under conditions of:

Cool gas (<100° C.),
No ions, and no hot electrons.
Laminar flow excludes atmosphere from process zone.
Contained Plasma Zone
Ground Electrode
Room Ambient
Dielectric Liner
The RF Electrode is typically driven at 13.56 Mhz, with about −80 Watts.
The maximum RF Power, in this example, is 120 W, but typical operating power is 60-100 W.

Four MFC's (mass flow controllers) are used to deliver non-toxic gases to a proprietary atmospheric plasma head with 25 mm-wide process zone. A glow discharge-type plasma is entirely contained inside the head. Note that this implementation is:

Compatible with reducing and oxidizing chemistry.
Simple, Effective and Safe Process
Simple process—no vacuum chamber.
Fast—completes in a few minutes
Safe for devices and personnel
No arc discharges, ions, bombardment, re-deposition, or spalling particulates.

The noble gas component of the mixture is not merely passive, but provides an important transport of energy to reaction sites. Helium (the "carrier" gas in the preferred embodiments) has two metastable energy levels ($2^1S$ and $2^3S$) at 19.8 and 20.6 eV. Once an electron is excited into this state (by RF plasma), it can only decay back to ground state by physical collision with other atoms. This occasionally occurs in the gas phase, but occurs strongly as the metastable helium atoms $He^m$ contact the substrate surface. This contact transfers quantum energy directly to the surface atoms and provides extra activation energy for surface chemical reactions. This is somewhat analogous to the surface activation that occurs in reactive ion etching, except there is essentially ZERO kinetic energy transfer occurring, and therefore, zero kinetic (bombardment) damage to the substrate. This is highly desirable for preparing the surfaces of sensitive semiconductor structures.

Figures 5A, 5B:
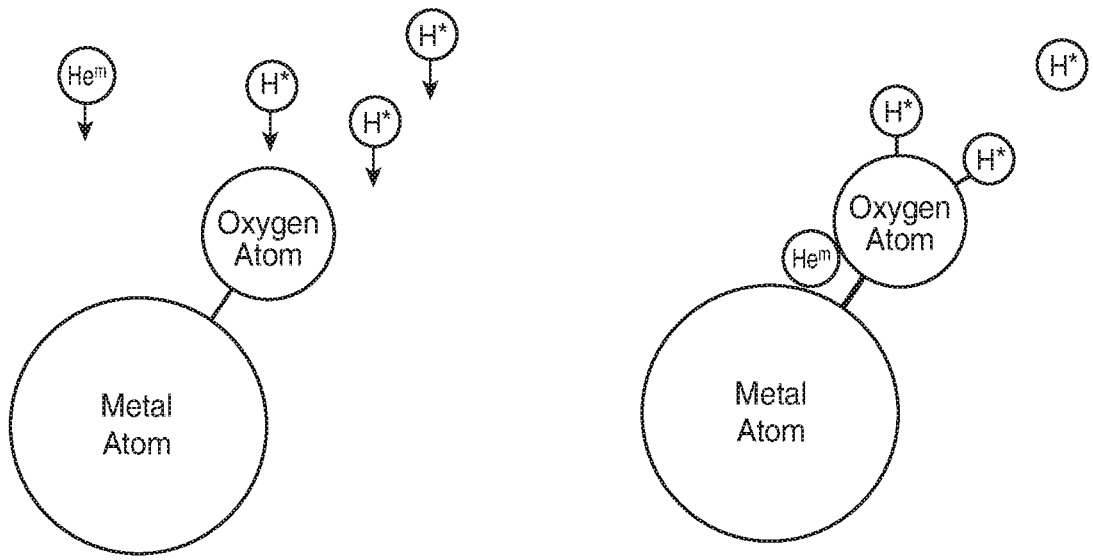
FIGS. 5A, 5B, and 5C show successive steps in one sample embodiment of substrate preparation before epitaxial growth.
Figure 5C:
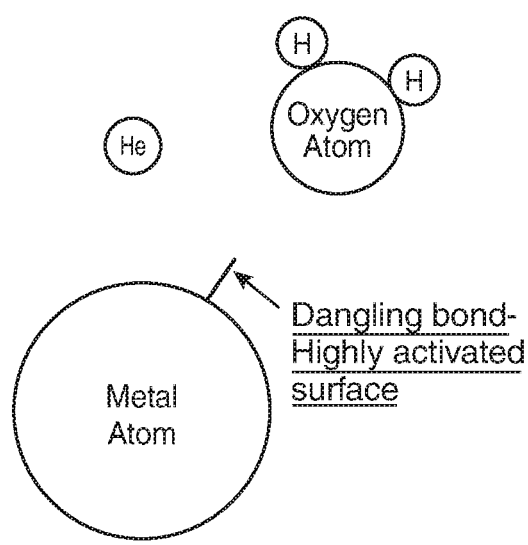

FIGS. 5A, 5B, and 5C show successive steps in one sample embodiment of substrate preparation before epitaxial growth. In this example metastable energized helium atoms $He^m$ are present, along with excited hydrogen atoms H* which provide a reducing chemistry. The excited hydrogen atoms H* attempt to bond to a surface oxygen atom which is bonded to a metal (or other) atom of the crystal lattice. When a metastable energized helium atom $He^m$ provides energy to the metal-oxygen bond, the hydrogen-oxygen bonding dominates, and the oxygen can flow away in the vapor phase as $H_2O$. At this point, as shown in FIG. 5C, the substrate atom is left in a highly active state, with a dangling bond. Oxide can be reduced from (e.g.) In, Sn, Ni, Cu, Sb, Ag, Au, and more.

Figure 6A:
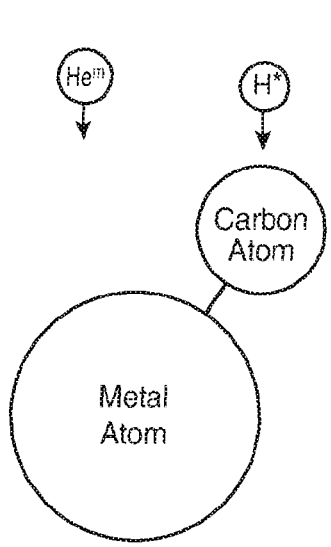
FIGS. 6A, 6B, and 6C show exemplary steps in one sample reduction process to remove organic contaminants.
Figure 6B:
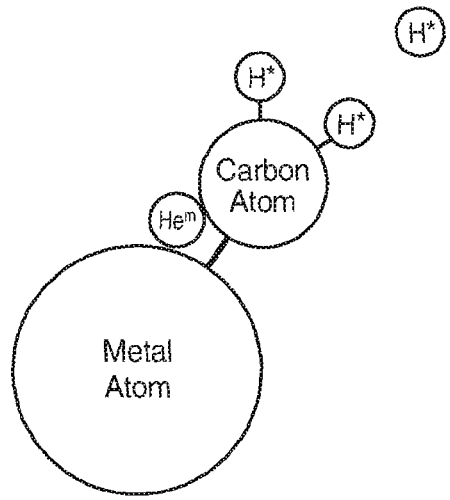
Figure 6C:
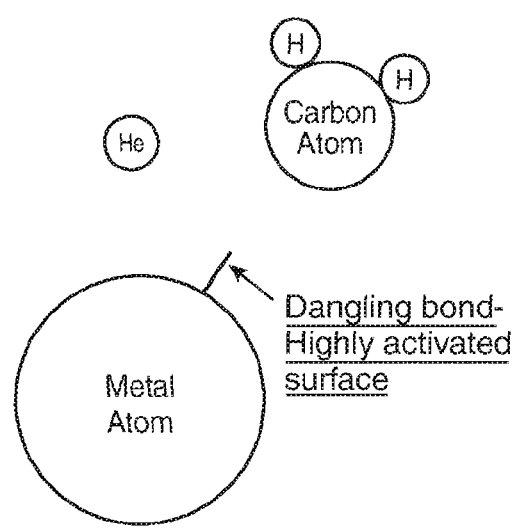

FIGS. 6A, 6B, and 6C show exemplary steps in one sample process to remove organic contaminants using reducing chemistry. Here the reducing downstream atmosphere includes metastable energized helium atoms $He^m$, as well as activated hydrogen radicals H*. The hydrogen radicals bond to a surface carbon atoms while the metastable energized helium atoms $He^m$ provide energy to disrupt the carbon-metal bond. This results, as shown in FIG. 6C, in a highly active surface.

Figure 7A:
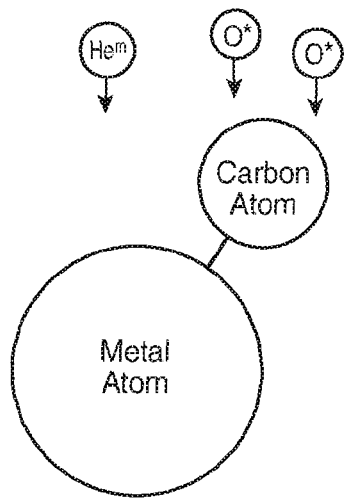
FIGS. 7A, 7B, and 7C show exemplary steps in one sample oxidation process to replace organic contaminants with oxygen radicals.
Figure 7B:
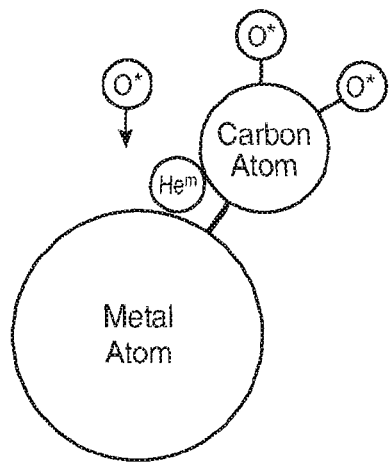
Figure 7C:
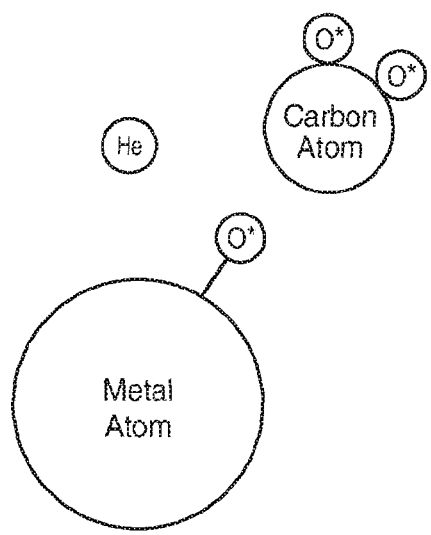

FIGS. 7A, 7B, and 7C show exemplary steps in one sample oxidation process to remove organic contaminants with oxygen radicals. In FIG. 7C, note that the dangling bonds are passivated with a monolayer of oxygen.

Figure 8A:
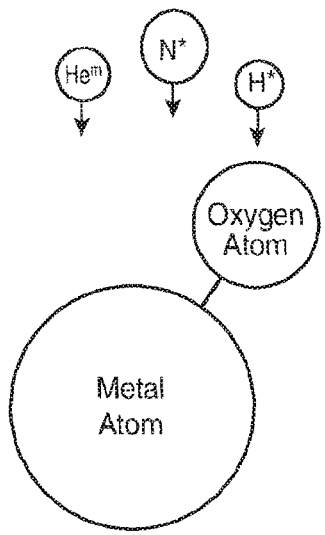
FIGS. 8A, 8B, and 8C show exemplary steps in one sample reduction and passivation process.
Figure 8B:
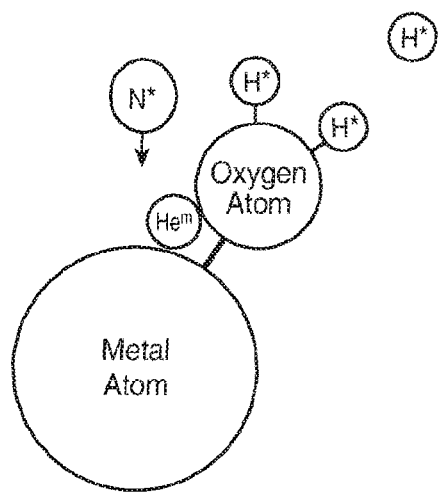
Figure 8C:
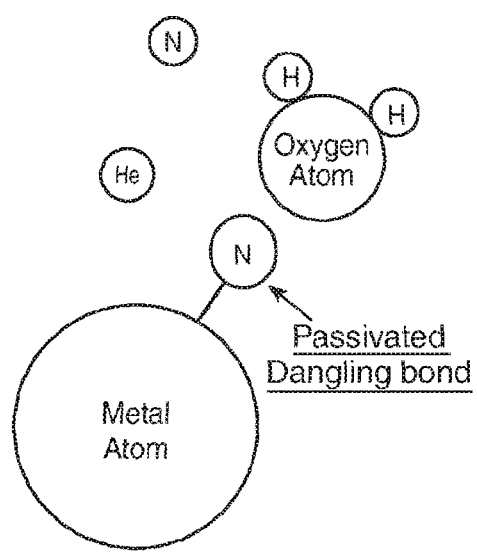

FIGS. 8A, 8B, and 8C show exemplary steps in another sample process, where the surface atoms are passivated as well as de-oxidized. Here the flow from the plasma includes activated nitrogen atoms N* as well as metastable energized helium Hem and hydrogen radicals H*. The result is a surface which not only has oxygen and organics removed, but which also is passivated with nitride bonds.

First Example of Preparation

A first preferred embodiment of the present application is as follows:

1. Substrate to be prepared: gallium antimonide (GaSb)
2. Atmospheric Plasma source: SETNA Ontos7 dielectric barrier discharge remote plasma head with 25 mm aperture and RF power=100 Watts.
3. Gas flow parameters: helium=10 standard liters per minute (SLPM), hydrogen=0.10 SLPM.
4. Scan parameters: scan speed=1in/sec, gap between plasma head and substrate=1 mm, rastered across wafer surface with overlap between neighboring scans=0 mm, 1 to 4 passes over the wafer depending on the extent of organic and/or oxide contamination.

Second Example of Preparation

A second preferred embodiment of the present application is as follows:
1. Same procedure as first preferred embodiment followed by:
2. Atmospheric Plasma source: SETNA Ontos7 dielectric barrier discharge remote plasma head with 25 mm aperture and RF power=80 Watts.
3. Gas flow parameters: helium=10 standard liters per minute (SLPM), oxygen=0.10 SLPM.
4. Scan parameters: scan speed=3 mm/sec, gap between plasma head and substrate=1 mm, rastered across wafer surface with overlap between neighboring scans=0 mm
5. Single pass scan.

Epitaxial Growth

The above description has detailed the preparation and passivation steps. The advantages of using these steps in a complete process for preparing epitaxial structures are important: notably, yield is improved, throughput is improved, cost of equipment is reduced, usage of chemical acids and solvents is reduced, and the need for highly skilled technologists is reduced somewhat.

The disclosed process is particularly important for compound semiconductor substrates (due to the problems of non-stoichiometric growth), but is not applicable only to these substrates.

The disclosed process is advantageous for semiconductor substrates, but is also applicable to other kinds of substrates. It is contemplated that the disclosed innovations can optionally be adapted to monocrystalline substrates such as sapphire, BaSrTiO3, or even to monocrystalline conductors.

It is to be understood that the present invention should not be limited to the above described embodiments, but may be practiced in various forms within the scope of the present invention. Variations in process parameters such as, plasma head manufacturer, RF power, gas composition, gas flow ratios, gas flow rates, scan speed, gap and number of passes may be viable to accomplish the same process goals within the scope of the present invention.

Additional general background, which helps to show variations and implementations, can be found in U.S. Pat. No. 8,567,658, which is hereby incorporated by reference.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: Ser. Nos. 13/781,927, 14/052,867, 62/078,598, and PCT/US13/28530.

Advantages

The disclosed innovations, in various embodiments, provide one or more of at least the following advantages. However, not all of these advantages result from every one of the innovations disclosed, and this list of advantages does not limit the various claimed inventions.
  Cost savings in epitaxial semiconductor growth;
  Cost savings in epitaxial growth on compound semiconductor substrates;
  Improved crystal quality in epitaxial semiconductor growth, and more consistent achievement of this quality;
  Improved crystal quality in epitaxial growth on compound semiconductor substrates, and more consistent achievement of this quality;
  Cost savings in reduction of acids and solvents required.
  Improved crystal quality in epitaxial semiconductor growth, and more consistent achievement of this quality;
  Improved crystal quality in epitaxial growth on compound semiconductor substrates, and more consistent achievement of this quality;
  Cost savings associated with higher yield and performance of subsequent devices fabricated on improved quality epi.
  Reduction in environmental impact, and cost of disposal, of acid and solvent wastes.
  Passivation enables longer queue times between substrate cleanup and epitaxial growth.

According to some but not necessarily all embodiments, there is provided: After CMP and before an epitaxial growth step, the substrate is prepared by an atmospheric plasma which includes not only a reducing chemistry, but also metastable states of a chemically inert carrier gas. This removes residues, oxides, and/or contaminants. Optionally, nitrogen passivation is also performed under atmospheric conditions, to passivate the substrate surface for later epitaxial growth.

According to some but not necessarily all embodiments, there is provided: A process for epitaxial growth of a crystalline thin film on a crystalline substrate, comprising the steps of: a) forming an atomically ordered crystalline surface on the crystalline substrate; b) flowing an activated gas mixture, which contains activated metastable states of a noble gas as well as one or more unstable reactive chemical species, through a glow discharge and downstream onto the surface of the crystalline substrate under atmospheric pressure, to thereby remove residues and/or oxidation from the ordered crystalline surface without disturbing the atomic order of the crystalline surface; c) enclosing the crystalline substrate in a reaction vessel which is not open to the atmosphere, and depositing a layer of a crystalline material onto the ordered crystalline surface, as a crystalline extension of the substrate crystallinity.

According to some but not necessarily all embodiments, there is provided: A process for epitaxial growth of a crystalline thin film on a crystalline substrate, comprising the steps of: a) forming an atomically ordered crystalline surface on the crystalline substrate; b) flowing an activated gas mixture, which contains activated metastable states of a noble gas as well as one or more unstable reducing chemical species, through a glow discharge and downstream through an aperture onto the surface of the crystalline substrate under atmospheric pressure, to thereby remove residues and/or oxidation from the ordered crystalline surface without disturbing the atomic order of the crystalline surface; wherein all portions of the substrate's surface are exposed to the activated gas mixture within less than two milliseconds after the activated gas mixture has exited the glow discharge; c) enclosing the crystalline substrate in a reaction vessel which is not open to the atmosphere, and depositing a layer of a crystalline material onto the ordered crystalline surface, as a crystalline extension of the substrate crystallinity.

According to some but not necessarily all embodiments, there is provided: A process for high-vacuum epitaxial growth of a crystalline thin film on a crystalline substrate, comprising the steps of: a) forming an atomically ordered crystalline surface on the crystalline substrate; b) flowing an activated gas mixture, which contains activated metastable states of a noble gas as well as one or more unstable reactive chemical species, through a glow discharge and downstream onto the surface of the crystalline substrate under atmospheric pressure, to thereby remove residues and/or oxidation from the ordered crystalline surface without disturbing the atomic order of the crystalline surface; c) enclosing the crystalline substrate in a reaction vessel which is not open to the atmosphere, and evacuating the reaction chamber to a pressure of less than $10^{-5}$ Torr, and heating the crystalline substrate under vacuum to desorb materials from the ordered crystalline surface, and depositing a layer of a crystalline material onto the ordered crystalline surface, as a crystalline extension of the substrate crystallinity.

According to some but not necessarily all embodiments, there is provided: A process for epitaxial growth of a crystalline thin film on a crystalline substrate, comprising the steps of: a) forming an atomically ordered crystalline surface on the crystalline substrate; b) flowing an activated gas mixture, which contains activated metastable states of a noble gas as well as one or more unstable reducing chemical species, through a glow discharge and downstream through an aperture onto the surface of the crystalline substrate under atmospheric pressure, to thereby remove residues and/or oxidation from the ordered crystalline surface without disturbing the atomic order of the crystalline surface; sweeping the relative positions of the nozzle and the crystalline substrate so that all portions of the substrate's surface are exposed to the activated gas mixture within less than two milliseconds after the activated gas mixture has exited the glow discharge; c) enclosing the crystalline substrate in a reaction vessel which is not open to the atmosphere, and depositing a layer of a crystalline material onto the ordered crystalline surface, as a crystalline extension of the substrate crystallinity.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For one example, other metastable energized species can optionally be substituted for helium. Both neon and argon have metastable energized states, though their energy is lower than that of helium.

For another example, the disclosed inventions are particularly advantageous for preparing II-VI substrates for epitaxial growth. Suitable materials can include CdZnTe, ZnS, CdTe, and even HgCdTe.

For another example, the substrate preparation steps described do not have to be applied only to a virgin substrate. Instead, these steps can be applied to an epitaxial structure, possibly after some processing, to prepare for a further epitaxial growth step.

The lifetimes of the excited and metastable atoms is different, but all are short. For example, under the conditions used in the above examples, the metastable helium atoms Hem will typically travel a few centimeters from the aperature, the oxygen radicals perhaps a few mm, the hydrogen radicals slightly less, and the nitrogen radicals about a centimeter. However, this distances can be changed by adjusting the source gas flow rate and/or the plasma drive power.

Nitrogen passivation can typically desorb under pre-MBE heating conditions—e.g. in the neighborhood of 350-400 C, or possibly as low as 250 C.

Note also that the disclosed inventions are not only applicable to epitaxial layers of normal thickness, but also to ALE (atomic layer epitaxy, for deposition of one or a few monolayers.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A process for epitaxial growth of a crystalline thin film on a crystalline substrate, comprising the steps of:
    a) forming an atomically ordered crystalline surface on the crystalline substrate;
    b) flowing an activated gas mixture, which contains activated metastable states of a noble gas as well as one or more unstable reactive chemical species, through a glow discharge and downstream onto the surface of the crystalline substrate under atmospheric pressure, to thereby remove residues and/or oxidation from the ordered crystalline surface without disturbing the atomic order of the crystalline surface;
    c) enclosing the crystalline substrate in a reaction vessel which is not open to the atmosphere, and depositing a layer of a crystalline material onto the ordered crystalline surface, as a crystalline extension of the substrate crystallinity.

2. The method of claim 1, further comprising performing said forming step by CMP.

3. The method of claim 1, further comprising performing said flowing step at approximately room temperature.

4. The method of claim 1, further comprising passivating the ordered crystalline surface between said flowing step and said enclosing step.

5. A process for epitaxial growth of a crystalline thin film on a crystalline substrate, comprising the steps of:
    a) forming an atomically ordered crystalline surface on the crystalline substrate;
    b) flowing an activated gas mixture, which contains activated metastable states of a noble gas as well as one or more unstable reducing chemical species, through a glow discharge and downstream through an aperture onto the surface of the crystalline substrate under atmospheric pressure, to thereby remove residues and/or oxidation from the ordered crystalline surface without disturbing the atomic order of the crystalline surface; wherein all portions of the substrate's surface are exposed to the activated gas mixture within less than two milliseconds after the activated gas mixture has exited the glow discharge;

c) enclosing the crystalline substrate in a reaction vessel which is not open to the atmosphere, and depositing a layer of a crystalline material onto the ordered crystalline surface, as a crystalline extension of the substrate crystallinity.

6. The method of claim 5, further comprising performing said forming step by CMP.

7. The method of claim 5, wherein said aperture is a linear aperture.

8. The method of claim 5, wherein said flowing step is performed at approximately room temperature.

9. The method of claim 5, further comprising passivating the ordered crystalline surface between said flowing step and said enclosing step.

10. A process for high-vacuum epitaxial growth of a crystalline thin film on a crystalline substrate, comprising the steps of:

a) forming an atomically ordered crystalline surface on the crystalline substrate;

b) flowing an activated gas mixture, which contains activated metastable states of a noble gas as well as one or more unstable reactive chemical species, through a glow discharge and downstream onto the surface of the crystalline substrate under atmospheric pressure, to thereby remove residues and/or oxidation from the ordered crystalline surface without disturbing the atomic order of the crystalline surface;

c) enclosing the crystalline substrate in a reaction vessel which is not open to the atmosphere, and evacuating the reaction chamber to a pressure of less than $10^{-5}$ Torr, and heating the crystalline substrate under vacuum to desorb materials from the ordered crystalline surface, and depositing a layer of a crystalline material onto the ordered crystalline surface, as a crystalline extension of the substrate crystallinity.

11. The method of claim 10, further comprising performing said step a) by CMP.

12. The method of claim 10, further comprising performing said step b) at approximately room temperature.

13. The method of claim 10, further comprising passivating the ordered crystalline surface between said step b) and said step c).

* * * * *